United States Patent [19]

Han

[11] Patent Number: 5,134,058

[45] Date of Patent: Jul. 28, 1992

[54] METHOD FOR FORMING A FINE PATTERN ON A SEMICONDUCTOR HAVING A STEP THEREIN

[75] Inventor: Woo-Sung Han, Suwon, Rep. of Korea

[73] Assignee: Samsung Electronics Co., Ltd., Suweon, Rep. of Korea

[21] Appl. No.: 606,750

[22] Filed: Oct. 31, 1990

[30] Foreign Application Priority Data

Aug. 30, 1990 [KR] Rep. of Korea .................. 13523

[51] Int. Cl.[5] .............................................. G03F 7/20
[52] U.S. Cl. .................................... 430/327; 430/322; 430/326; 430/394; 430/396
[58] Field of Search ............... 430/320, 325, 327, 394, 430/396, 322, 326

[56] References Cited

U.S. PATENT DOCUMENTS

| | | | |
|---|---|---|---|
| 4,859,573 | 8/1989 | Maheras et al. | 430/394 |
| 4,869,999 | 9/1989 | Fukuda | 430/394 |
| 4,931,380 | 6/1990 | Owens et al. | 430/327 |

*Primary Examiner*—Marion E. McCamish
*Assistant Examiner*—Kathleen Duda
*Attorney, Agent, or Firm*—Robert E. Bushnell

[57] ABSTRACT

A method for forming an accurate pattern on a semiconductor element that has a step. The method includes the steps of coating a photosensitive material on the surface of the semiconductor, pre-exposing to ultraviolet rays the photosensitive material exisiting in the non-step area which is formed on the surface of the semiconductor other than step area, through a first photomask, exposing the entire photosensitive material through a second photomask with a desired pattern to ultraviolet after removing the first photomask, and developing and removing only photosensitive material that is exposed to ultraviolet in the pre-exposing and exposing steps.

7 Claims, 2 Drawing Sheets

METHOD FOR FORMING A FINE PATTERN ON A SEMICONDUCTOR HAVING A STEP THEREIN

BACKGROUND OF THE INVENTION

The present invention generally relates to a method for forming a pattern on a semiconductor element, and more particularly to a method for forming a fine pattern in a process of semiconductor photoetching.

Ever since high-degree integration of semiconductor elements has become a known technology in manufacturing semiconductor elements, a precise photoetching technology has become a key to getting the high-degree integration.

In general, since a manufacturing process for a semiconductor element includes the repeating steps of coating and forming a plurality of layers or films on a substrate, forming a pattern thereon to make a window, and injecting impurities, it cannot be over-emphasized that how a fine pattern is formed determines reliability of semiconductor element.

FIGS. 1A to 1C illustrate process diagrams of a generally employed conventional photoetching process for forming a pattern.

In FIG. 1A, when a first photomask with a given pattern designed therein is exposed to ultraviolet rays 2, hereafter referred to as ultra-violet 2, photo-sensitive (or photosensitive) materials 4, 5 coated on a semiconductor having a step 3, as shown in FIG. 1B, get differentiated as a photo-sensitive material 4 exposed to the ultra-violet 2 and a photo-sensitive material 5 not exposed to the ultra-violet according to pattern of the first photo mask. However, since the photo-sensitive material (step area) coated on the surface of the step 3 and the other photo-sensitive material (non-step area) coated on the surface of the semiconductor other than the step area, are different in their thicknesses, the non-step area is not completely exposed to the ultra-violet 2 whereby a photo-sensitive material 6 remains unexposed to the ultra-violet 2 when the exposure to the ultra-violet 2 is performed through the first photomask having a given pattern. It can be easily understood that such a problem is caused by irregular thicknesses of the photo-sensitive material due to the existence of the step 3. Because of the problem, an unexposed photo-sensitive material 6 which is in the non-step area still remains as shown in the FIG. 1C, even when the photo-sensitive material 4 exposed to the ultra-violet 2 has been removed by applying a developing solution, so as to block the formation of an accurate pattern. That is, there exists a problem that it is difficult to form a precise and satisfactory pattern on the surface of the semiconductor that has the step.

SUMMARY OF THE INVENTION

It is therefore an object of the present invention to provide a method for forming an accurate pattern on a semiconductor that has a step.

In order to achieve the above described object, the inventive method for forming the accurate pattern on the semiconductor having a step includes the steps of: pre-exposing only photo-sensitive material residing in the non-step area to the ultra-violet down to a given depth; and then, exposing the entire photo-sensitive material to the ultra-violet so as to form a desired fine pattern.

BRIEF DESCRIPTION OF THE DRAWINGS

For a better understanding of the invention and to show how the same may be carried into effect, reference will now be made, by way of example only, to the accompanying diagrammatic drawings, wherein.

DETAILED DESCRIPTION OF THE PREFERRED EMBODIMENTS

Figure 1A:
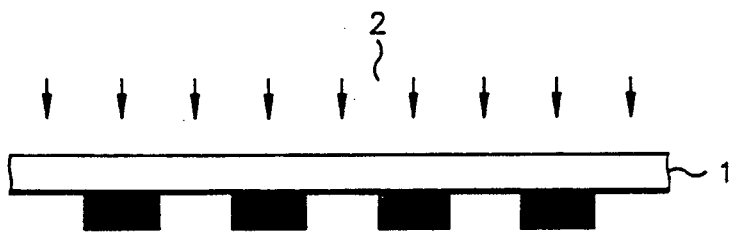
FIGS. 1A to 1C are views for showing a conventional method of forming a pattern on a semiconductor.
Figure 1B:
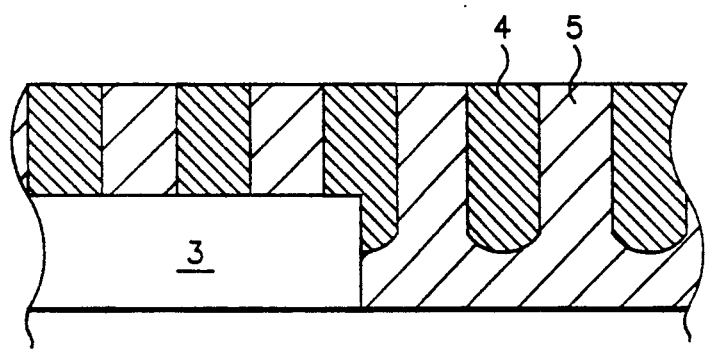
Figure 1C:
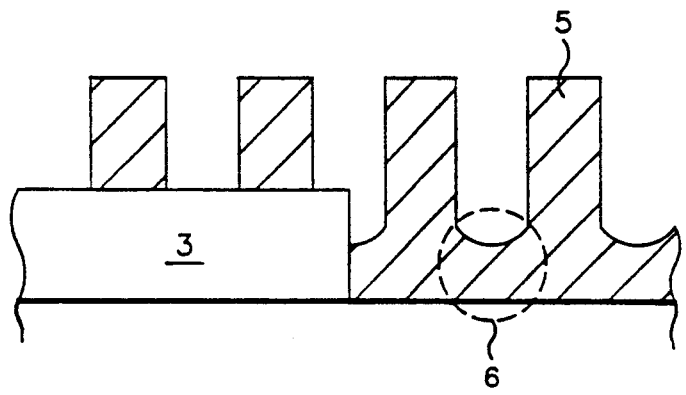
Figure 2A:
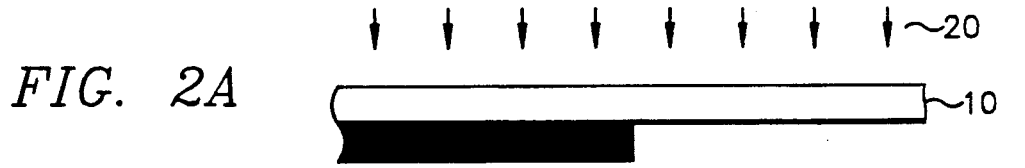
FIGS. 2A to 2E are views for showing a method for forming a pattern according to the present invention.

Referring now to FIGS. 2A to 2E, a first photomask 10 shown in FIG. 2A is designed in such a way that, in consideration of a step 30 of FIG. 3B, only photo-sensitive material coated on the surface of the step 30 is blocked from ultra-violet 20. Thus, the photo-sensitive materials 40, 50 that have photo-sensitivity of about 30 to 70%, which is a non-step area, are exposed to the ultra-violet 20. Herein, the photo-sensitivity refers to a minimum photo-exposure (or photoexposure) energy enough to expose the bottom of a photo-sensitive material when the photo-sensitive material is exposed to ultra-violet 20. This energy is represented in a unit of milliJoule/cm$^2$.

The photo-sensitive solution used in this embodiment is TSMR-365LB manufactured by Tokyo Oka Co., Ltd. and has a photo-sensitivity of 120 milliJoule/cm$^2$. The solution is positive exposure type and thickness of the step 30 is about 0.3 to 1.0 micro meters.

Figure 2B:
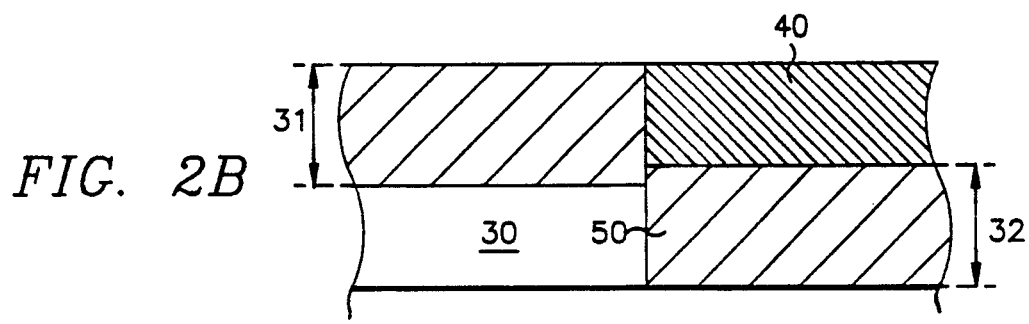

That is, since only the photo-sensitive materials 40, 50 residing in the area that do not have step is exposed to ultra-violet 20 as shown in FIGS. 2A, 2B, the photo-exposure energy is 35 to 84 milliJoule/cm$^2$ that is about to 30 to 70% of the photo-sensitivity. And after the pre-exposure process is completed, it is preferable that thicknesses 31, 32 of unexposed photo-sensitive material are the same across the surface of the semiconductor including the surface of the step 30.

Figure 2C:
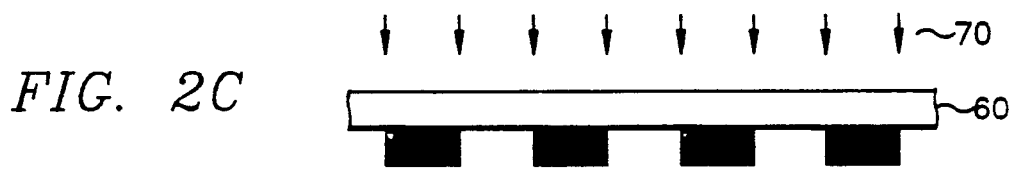
Figure 2D:
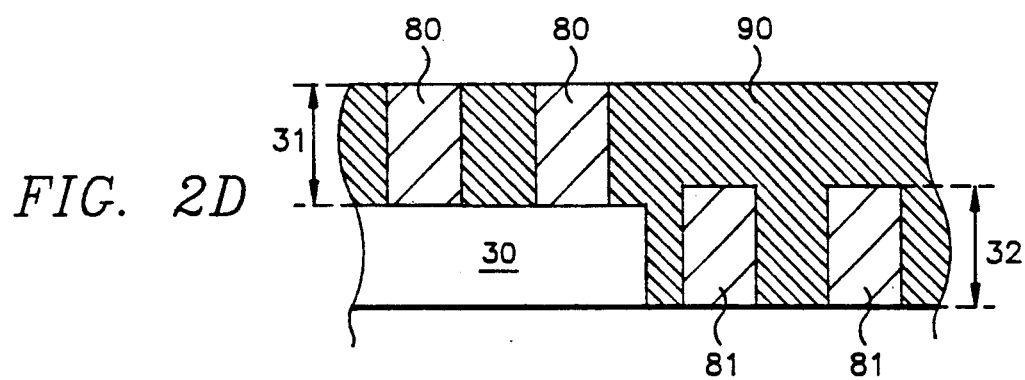

Next, when a second exposure is performed using a second photomask 60 that has a desired given pattern in FIG. 2C, unexposed photo-sensitive materials 81 residing in the non-step area as well as unexposed photo-sensitive materials 80 residing in the step area are equally exposed down to the bottom as shown in FIG. 2D.

Figure 2E:
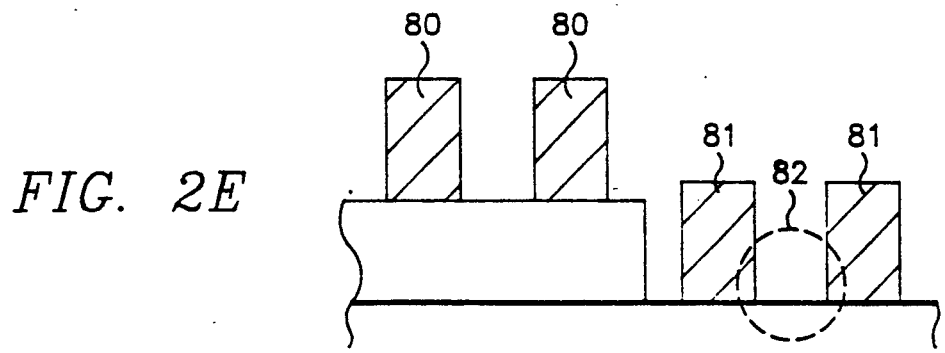

Thereafter, the photo-sensitive material 90 which has become soluble due to the exposure to the ultra-violet, is removed by a developing solution NMD-W of 2.38% concentration, manufactured by Tokyo Oka Co., Ltd. An accurate pattern is formed as shown in FIG. 2E. A result that no unexposed photo-sensitive material remains on a surface area 82 of the semiconductor, as shown in FIG. 2E, is obtained. This is because the pre-exposure in FIGS. 2A, 2B evened the thickness of the photo-sensitive material which later is exposed to ultra-violet 70 to form a desired accurate pattern.

Though the step with the thickness of 0.3 to 1.0 micro meters was used in the embodiment of the present invention, the same can be carried into effect by adjusting the photo-exposure energy to the photo-sensitive material according to the thickness of the step.

As stated in foregoing description, the present invention has an advantage of bringing a substantial increase in the reliability of photoetching process, which is performed on the surface of a semiconductor that may have the step, because the invention can prevent uneven formation of a pattern that is caused by lack of exposure in the non-step area formed on the surface of the semiconductor.

What is claimed is:

1. A method for forming a pattern on a semiconductor having at least an elevated step, an elevated area being formed on the surface of the elevated step and a non-elevated area being formed on the surface of the semiconductor other than the elevated area, comprising the consecutive steps of:

coating a photosensitive material on the surface of the semiconductor;

pre-exposing to a predetermined depth only the photosensitive material existing in the non-elevated area, through a first photomask, to ultraviolet rays;

exposing desired sections of said photosensitive material existing over said elevated area and said non-elevated area, through a second photomask with a given pattern, to the ultraviolet rays after removing the first photomask; and developing and removing only photosensitive material that has been exposed to the ultraviolet rays in said pre-exposing step and photosensitive material that has been exposed to the ultraviolet rays in said exposing step.

2. The method for forming the pattern as claimed in claim 1, wherein:

said photosensitive material has a predetermined photosensitivity; and in said pre-exposing step said photosensitive material existing in the non-elevated area is exposed to said ultraviolet rays at a photoexposure energy 30 to 70% of said predetermined photosensitivity.

3. The method for forming the pattern as claimed in claim 2, wherein said predetermined photosensitivity is 120 milliJoule/cm$^2$ and said photoexposure energy is between 35 and 84 milliJoule/cm$^2$.

4. The method for forming the pattern as claimed in claim 1, wherein said photosensitive material is a positive photosensitive material.

5. A method for forming a pattern on a surface of a solid material having at least an elevated step, an elevated area being formed on the surface of the elevated step and a non-elevated area being formed on the surface of the solid material other than the elevated area, comprising the consecutive steps of:

coating a photosensitive material on the surface of the solid material;

pre-exposing to a desired depth only the photosensitive material existing in the non-elevated area, through a first photomask, to ultraviolet rays;

exposing desired areas of said photosensitive material existing over said elevated area and said non-elevated area, through a second photomask with a given pattern, to the ultraviolet rays after removing the first photomask; and developing and removing only the photosensitive material that has been exposed to the ultraviolet rays in said pre-exposing step and photosensitive material that has been exposed to the ultraviolet rays in said exposing step.

6. The method for forming the pattern as set forth in claim 5, wherein:

said photosensitive material has a predetermined photosensitivity; and in said pre-exposing step said photosensitive material existing in the non-elevated area is exposed to said ultraviolet rays at a photoexposure energy 30 to 70% of said predetermined photosensitivity.

7. The method for forming the pattern as set forth in claim 6, wherein said predetermined photosensitivity is 120 milliJoule/cm$^2$ and said photoexposure energy is between 35 and 84 milliJoule/cm$^2$.

* * * * *

UNITED STATES PATENT AND TRADEMARK OFFICE
CERTIFICATE OF CORRECTION

PATENT NO. : 5,134,058
DATED : 28 July 1992
INVENTOR(S) : Woo-Sung HAN

It is certified that error appears in the above-indentified patent and that said Letters Patent is hereby corrected as shown below:

Column 2, line 17, after "FIG.", change "3B" to --2B--:

Signed and Sealed this

Twenty-seventh Day of August, 1996

Attest:

BRUCE LEHMAN

Attesting Officer

Commissioner of Patents and Trademarks